United States Patent
Zeng et al.

(10) Patent No.: US 8,448,041 B1
(45) Date of Patent: May 21, 2013

(54) MULTISTAGE LDPC ENCODING

(75) Inventors: Lingqi Zeng, San Jose, CA (US);
Abhiram Prabhakar, Fremont, CA (US); Kin Man Ng, Cupertino, CA (US); Yu Kou, San Jose, CA (US)

(73) Assignee: SK hynix memory solutions inc., San Jose, CA (US)

(*) Notice: Subject to any disclaimer, the term of this patent is extended or adjusted under 35 U.S.C. 154(b) by 278 days.

(21) Appl. No.: 12/970,731

(22) Filed: Dec. 16, 2010

Related U.S. Application Data

(60) Provisional application No. 61/337,287, filed on Feb. 1, 2010.

(51) Int. Cl.
*G06F 11/00* (2006.01)

(52) U.S. Cl.
USPC .................................................. 714/758

(58) Field of Classification Search
USPC .................................................. 714/758
See application file for complete search history.

(56) References Cited

U.S. PATENT DOCUMENTS

| | | | |
|---|---|---|---|
| 5,905,666 A * | 5/1999 | Hoffman et al. ............ | 700/99 |
| 6,757,122 B1 | 6/2004 | Kuznetsov et al. | |
| 7,962,828 B2 * | 6/2011 | Kyung et al. ............. | 714/758 |
| 8,095,859 B1 | 1/2012 | Peterson et al. | |
| 8,196,010 B1 * | 6/2012 | Gunnam et al. ........... | 714/758 |
| 8,255,764 B1 | 8/2012 | Yeo et al. | |
| 8,255,765 B1 | 8/2012 | Yeo et al. | |
| 8,347,190 B2 * | 1/2013 | Brauchle et al. .......... | 714/781 |
| 8,359,515 B2 * | 1/2013 | Gunnam .................. | 714/752 |
| 2002/0188906 A1 * | 12/2002 | Kurtas et al. ............ | 714/755 |
| 2008/0052594 A1 | 2/2008 | Yedidia et al. | |
| 2008/0126908 A1 | 5/2008 | Lin | |
| 2008/0163027 A1 * | 7/2008 | Richardson et al. ........ | 714/758 |
| 2008/0276156 A1 | 11/2008 | Gunnam et al. | |
| 2008/0301521 A1 | 12/2008 | Gunnam et al. | |
| 2009/0138785 A1 | 5/2009 | Sakai et al. | |
| 2009/0150746 A1 | 6/2009 | Chaichanavong et al. | |
| 2009/0327847 A1 | 12/2009 | Shen et al. | |
| 2010/0023838 A1 | 1/2010 | Shen et al. | |
| 2010/0153819 A1 | 6/2010 | Ueng et al. | |
| 2010/0162074 A1 | 6/2010 | Oh et al. | |
| 2010/0169736 A1 | 7/2010 | Garani | |
| 2010/0257425 A1 | 10/2010 | Yue et al. | |
| 2012/0221913 A1 * | 8/2012 | Anholt et al. ............ | 714/752 |

OTHER PUBLICATIONS

Li et al., "Efficient Encoding of Quasi-Cyclic Low-Density Parity-Check Codes," IEEE Transactions on Communications, vol. 54, No. 1, Jan. 2006.

* cited by examiner

*Primary Examiner* — Marc Duncan
(74) *Attorney, Agent, or Firm* — Van Pelt, Yi & James LLP

(57) ABSTRACT

Low-density parity-check (LDPC) encoding is performed by encoding input data using a first sub-matrix of a parity check matrix to obtain intermediate data. The parity check matrix includes the first sub-matrix and a second sub-matrix having a matrix inversion. The intermediate data is encoded using the matrix inversion of the second sub-matrix of the parity check matrix.

19 Claims, 8 Drawing Sheets

MULTISTAGE LDPC ENCODING

CROSS REFERENCE TO OTHER APPLICATIONS

This application claims priority to U.S. Provisional Patent Application No. 61/337,287 entitled EFFICIENT ENCODING OF A GENERAL LDPC CODE filed Feb. 1, 2010 which is incorporated herein by reference for all purposes.

BACKGROUND OF THE INVENTION

Unlike some other error correction codes, with low-density parity-check (LDPC) codes the computational complexity is on the encoding side as opposed to the decoding side. Some subsets of the LDPC codes, such as quasi-cyclic LDPC (QC-LDPC) codes, reduce the computational complexity and/or storage requirements on the encoder side, but still impose a relatively high cost at the encoder. It would be desirable to develop encoding techniques (applicable to QC-LDPC codes as well as more general LDPC codes (i.e., general LDPC codes can be seen as a special QC-LDPC codes with circulant size of 1) which (further) reduce computational complexity and/or storage requirements in an encoder.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
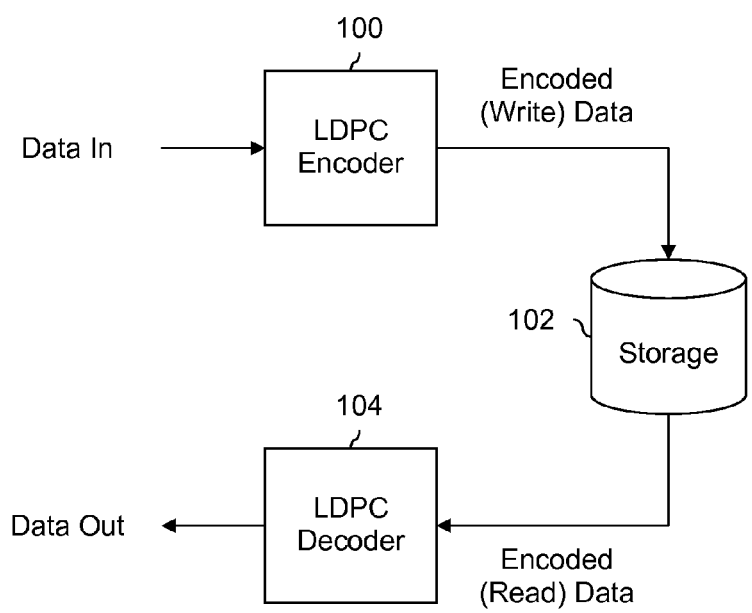
FIG. 1 is a diagram showing an embodiment of a system configured to encode and store data using a low-density parity-check (LDPC) code.

FIG. 1 is a diagram showing an embodiment of a system configured to encode and store data using a low-density parity-check (LDPC) code. In the example shown, LDPC encoder 100 receives data in and includes (or is based on) data which is desired to be stored. In some embodiments, multiple layers of coding are performed and the data received is already encoded (e.g., with another type of code such as a Reed Solomon code). Similarly, after encoding by LDPC encoder 100, in some embodiments another layer of encoding is performed.

In the example shown, encoded write data is output by LDPC encoder 100; this data is stored in storage 102. In various embodiments, storage 102 includes a variety of storage types or media such as (e.g., magnetic) disk drive storage, Flash storage, etc. When the stored data is requested or otherwise desired (e.g., by an application or user that stored the data), LDPC decoder 104 accesses storage 102 and retrieves encoded read data, along with some noise or errors. LDPC decoding is performed on the read-back data by decoder 104 and data out is passed to the appropriate entity (e.g., the user or application which requested it). With proper encoding and decoding, the data in matches the data out.

In LDPC coding, the code is defined by or otherwise characterized by a parity check matrix (H). H is a matrix of size m×n, which is also an rr×cc array of q×q circulants (i.e., rr*q=m and cc*q=n). From the parity check matrix, a second matrix (G), referred to herein as the generator matrix, is generated. For cases where the parity check matrix (H) is a full rank matrix, the generator matrix (G) has dimension of (n−m)×n. A full rank parity check matrix H is one where all rows in the matrix are linearly independent of all other rows. The generator matrix (G) is used to generate encoded data from the input data. For example, if the input data is represented as u, a 1×(n−m) matrix, and the encoded write data is represented as c (a 1×n matrix) then c=u*G, where "*" is a matrix multiplication. In some cases, the generator matrix (G) is manipulated to be in a special form (i.e., a systematic matrix) where G=[I P] and I is the identity matrix and P is a parity generator matrix. In systematic form, the encoded data (c) includes the input data (u) in its original form. In one example, the encoded data may be the input data (u) followed by the parity bits. Parity data (p) may be obtained from u*P and when combined with the input data generates the codeword (i.e., the encoded data).

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

What is described herein is a multistage (e.g., two-stage) LDPC encoder where the parity check matrix (H) is broken down into two or more sub-matrices and encoding is done in two or more stages using the sub-matrices and the transformation (i.e., inversion) of the sub-matrices. The following figures describe some embodiments of such a multistage LDPC encoder.

Figure 2A:
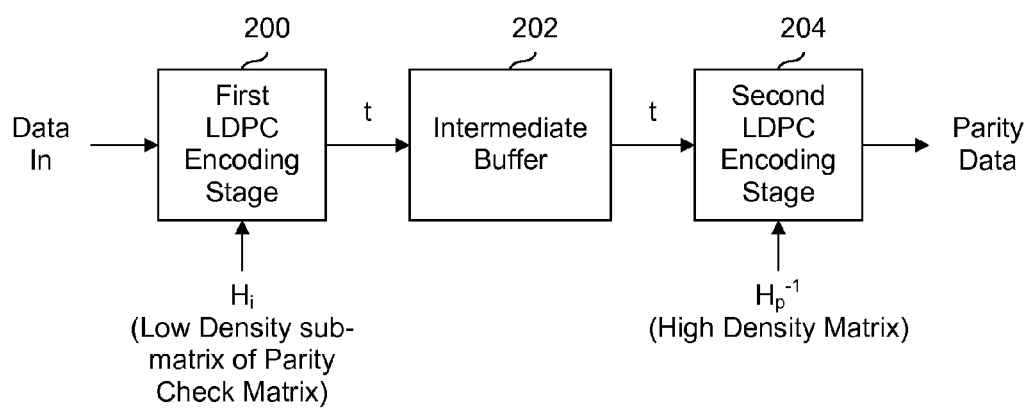
FIG. 2A is a diagram showing an embodiment of a two stage LDPC encoder.

FIG. 2A is a diagram showing an embodiment of a two stage LDPC encoder. In the example shown, a parity check matrix H (not shown) is broken down into two sub-matrices: a m×(n−m) sub-matrix and a m×m sub-matrix $H_p$. The inversion of the sub-matrix $H_p$ has the same size of m×m and is a relatively high density matrix (e.g., in one example the ratio of 1's to 0's is roughly 1 to 1), denoted by $H_p^{-1}$; the sub-matrix has a relatively low density (e.g., mostly 0's with relatively few 1's). $H_p$ is a low density matrix whereas the inversion of $H_p$ (i.e., $H_p^{-1}$ is high density. The size of the two sub-matrices varies depending upon the values of m and n; in some cases with exemplary and/or typical values for m and n (i.e., m<<n), the size of the sub-matrix $H_p$ and its inversion $H_p^{-1}$ is much smaller compared to the size of the sub-matrix $H_i$. In some embodiments, LDPC encoder 100 shown in FIG. 1 is implemented as shown in this figure.

The low density sub-matrix and a high density matrix $H_p^{-1}$ are passed to and used respectively by the first LDPC encoding stage (200) and the second LDPC encoding stage (204). The first encoding stage (200) performs the operation $u*H_i^T$ where u is the 1×(n−m) matrix of input data. $H_i^T$ is an (n−m)×m matrix so the matrix multiplication results in intermediate data (t) in the form of a 1×m matrix.

The intermediate data is passed to intermediate buffer 202 where it is stored. For example, second encoding stage 204 may be busy with other intermediate data (e.g., associated with earlier input data) and when second encoding stage 204 is free the stored intermediate data is retrieved from intermediate buffer 202. In some embodiments, intermediate buffer 202 includes 2 "ping pong" buffers or memories which switch off. For example, while intermediate data for a first (e.g., later arriving) set of input data is being generated by first encoding stage 200 and is being written to the first buffer, intermediate data associated with a second (e.g., earlier arriving) set of input data is being passed from the second buffer to the second encoding stage (204). Once the first buffer is full and the second buffer has been emptied, the two buffers switch off (i.e., the first buffer offloads its intermediate data to the second encoding stage while the second buffer receives intermediate data associated with a third (e.g., even later arriving) set of input data from the first encoding stage). In some embodiments, buffer 202 includes one or more FIFOs so that first encoding stage 200 and second encoding stage 204 do not need to deal with memory addresses when loading or unloading intermediate data (t).

Second encoding stage 204 performs the operation $t*(H_p^{-1})^T$ which produces parity data in the form of a 1×m matrix. By combining the parity data with the input data (e.g., via concatenation), LDPC encoded data in systematic form may be produced.

In some applications, a two-stage encoder is used in a disk drive storage system. In some such embodiments, encoding is performed by each stage in 1 sector time (i.e., the amount of time is takes to read 1 sector from the disk) or less and the latency (i.e., the amount of time from when the last input bit is received to when the last parity bit is output) is also 1 sector time. Some applications may care more about throughput compared to latency and a 1 sector latency may be acceptable.

Using a two-stage encoding technique as described herein may have a number of advantages. For example, using two stages may result in fewer actual operations being performed when generating encoded data. Also, using two-stage encoding technique requires much less memory storage. The following table shows operations and corresponding sizes of matrix multiplications that are performed.

TABLE 1

| | Operation | Size of matrix multiplication | Comments |
|---|---|---|---|
| Integrated (parity only) | p = u * P | (1 × (n − m)) * ((n − m) × m) | This operation generates the parity data only; G is a relatively high density matrix |
| Stage 1 | $t = u * H_i^T$ | (1 × (n − m)) * ((n − m) × m) | $H_i$ is low density sub-matrix of parity check matrix |
| Stage 2 | $p = t * (H_p^{-1})^T$ | (1 × m) * (m × m) | This operation generates the parity data only; $H_p^{-1}$ is high density matrix |

In Table 1 shown above, the integrated technique is a straightforward process where the parity data (p) is generated by performing the operation u*P. The size of the matrix operation of the integrated technique is the same as the size of the matrix operation for the first encoding stage (i.e., a (1×(n−m))*((n−m)×m) matrix operation). Of those potential operations, the integrated approach has a higher percentage of potential operations which are "actual" operations (i.e., they are not zeroed out because of multiplication by 0). This is because the G matrix has a relatively high density (e.g., roughly the same number of 1's and 0's) whereas $H_i$ (and therefore $H_i^T$) has a relatively low density (e.g., few 1's and mostly 0's). A relatively high percentage of the multiplications for the first encoding stage will be zeroed out (because most of the values in the $H_i^T$ matrix are 0's) whereas the G matrix has a lower density of 0's and a lower percentage of operations will be zeroed out. Put another way, if the number of actual operations=α×(number of potential operations) where α is a scaling factor related to the density of a matrix (e.g., P or $H_i^T$) which ranges from 0 to 1, the value of α is lower for the first encoding stage (e.g., typically <0.05) compared to the integrated approach, typically ~0.5.

With respect to storage requirements, the integrated approach needs to store the high density matrix P of size (n−m)×m. Since the quasi-cyclic structure can help reduce the storage by a factor of q, the size of the circulant, the memory requirement for integrated approach is (n−m)×m/q bits. For two-stage encoding approach, $H_i^T$ required for first stage is not considered as an addition memory requirement for encoding because it is already stored for decoding purpose. So only $H_p^{-1}$ required for second stage encoding is considered as encoding memory storage, which is m×m/q bits. In storage application, the typical ratio of (n−m) and m is around 10. That is, with two-storage encoding approach, the memory saving is ~90%.

Since the matrix $H_p^{-1}$ is a high density matrix like P, the matrix multiplication for the second encoding stage shown in the table above has roughly the same scaling factor α as that of matrix multiplication in integrated approach. However, because n−m is typically (much) larger than m, the number of operations associated with the second encoding stage is much smaller than that of integrated approach. Because the two-stage encoding approach can pipeline the first stage and the second stage encoding, we have a sector time to do the second stage encoding. That is, the saving on the number of operations of the second stage encoding compared with that of the integrated approach can be directly translated into the saving on the hardware complexity by time-sharing the same hardware.

Figure 2B:
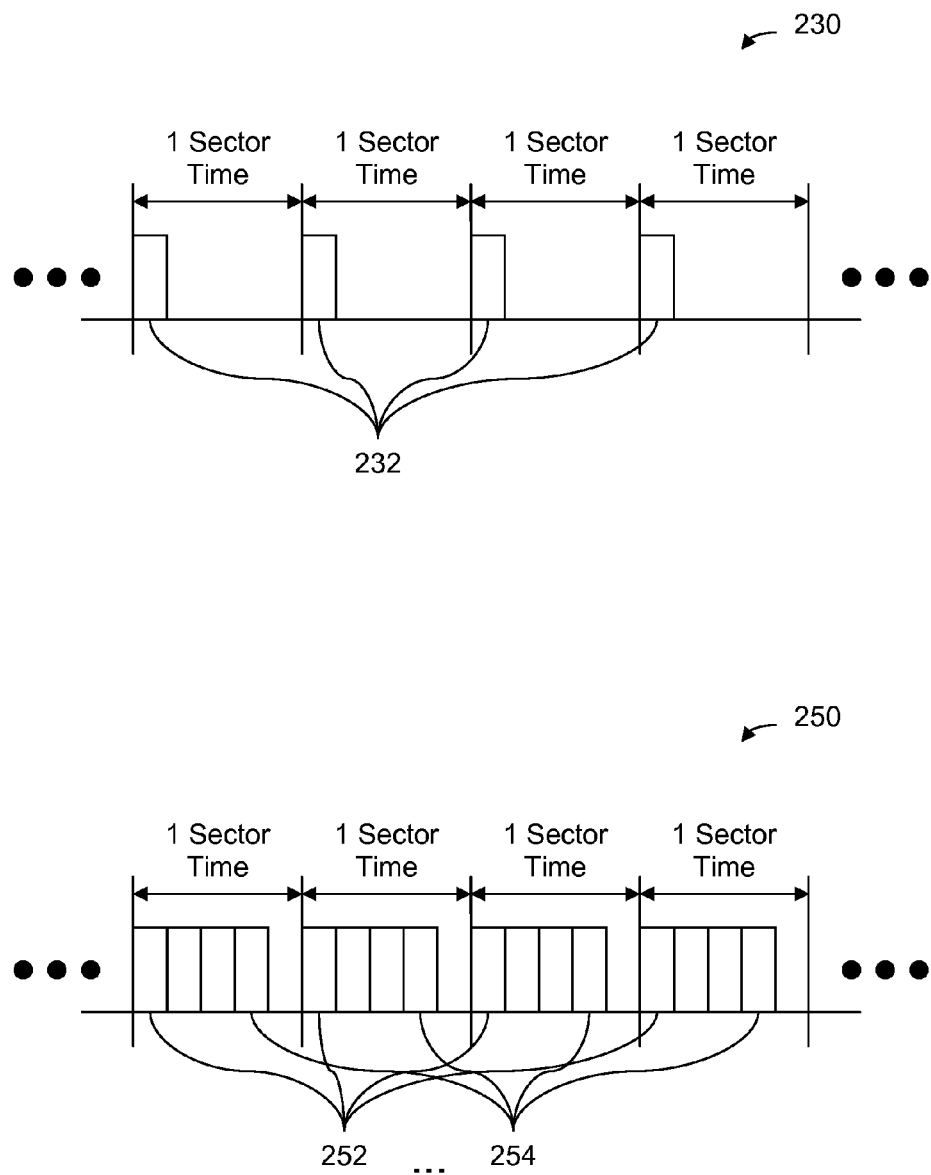
FIG. 2B is a diagram showing embodiments of timing diagrams corresponding to two different implementations of a second encoding stage of the two-stage approach.

FIG. 2B is a diagram showing embodiments of timing diagrams corresponding to two different implementations of a second encoding stage of the two-stage approach. In the example shown, timing diagram 230 corresponds to an encoding stage (e.g., a first or second encoding stage) where the encoding stage has all of the logic (e.g., multipliers and adders) needed to perform the encoding in a single operation. In the example shown, the system is a disk drive system and the desired completion time for the (e.g., first or second) encoding stage is a single sector time. Processing time 232 shows the portion of each sector time consumed in performing the encoding.

Timing diagram 250 shows a timing diagram corresponding to an encoding stage (e.g., a first or second encoding stage) where the data to be encoded is divided into multiple portions (in this example, 4 groups) and the logic (e.g., multipliers and adders) is reused. For example, the encoding stage corresponding to timing diagram 250 may have $1/4^{th}$ the amount of logic (e.g., multipliers and adders) compared to the encoding stage corresponding to timing diagram 230. Processing time 252 shows the time spent processing the first fourth of data to be encoded and processing time 252 shows the time spent processing the last fourth of data to be encoded. The total amount of processing time (i.e., to process all 4 groups) is still less than 1 sector time and the data is encoded in sufficient time (i.e., is encoded in less than 1 sector time) to meet desired system requirements.

In some applications, including less logic in a system and reusing the logic is desirable because the system is smaller and/or less expensive but still finishes encoding within a desired amount of time. Some example applications in which this may be desirable include price sensitive storage applications (e.g., ones in which consumers are very sensitive to the cost of the system and seek out low prices). For example, the cost to manufacture a ASIC increases with the amount of logic and thus reducing logic (e.g., multipliers and adders) correspondingly reduces manufacturing costs.

Figure 3:
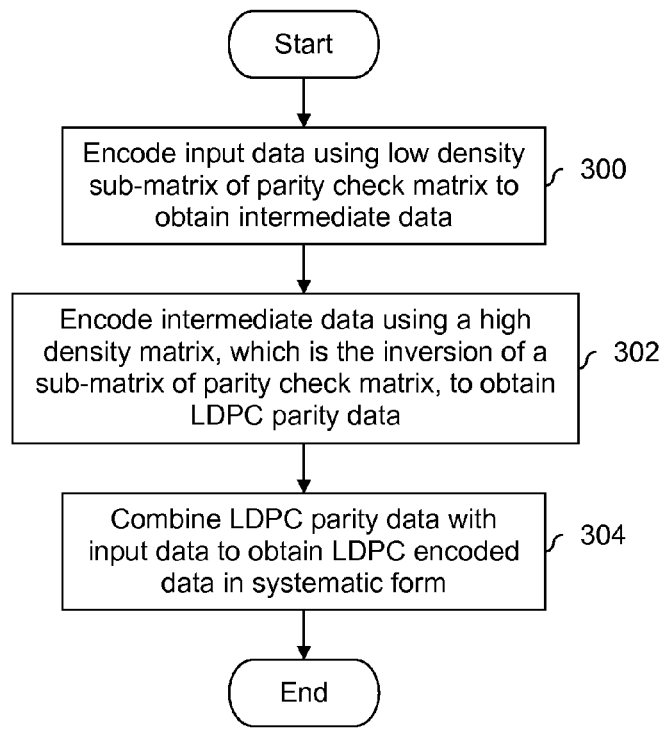
FIG. 3 is a flowchart illustrating an embodiment of a process for generating LDPC encoded data using a two stage encoder.

FIG. 3 is a flowchart illustrating an embodiment of a process for generating LDPC encoded data using a two stage encoder. In some embodiments, the process is performed using the system shown in FIG. 2A.

At 300, input data is encoded using a low density sub-matrix of a parity check matrix to obtain intermediate data. For example, the parity check matrix (H) is broken down into a m×(n−m) sub-matrix $H_i$ and a m×m submatrix $H_p$ and is input to a first encoding stage. In some embodiments, the and the inversion of $H_p$ are stored in memory and passed to the various stages when needed. Referring back to FIG. 2A, in some embodiments, step 300 is performed by first encoding stage 200.

Intermediate data is encoded using the inversion of the sub-matrix $H_p$ of a parity check matrix to obtain LDPC parity data at 302. In some embodiments, the intermediate data is stored in a buffer and step 302 includes retrieving the intermediate data from a buffer. Referring back to FIG. 2A, in some embodiments, step 302 is performed by second encoding stage 204.

At 304, the LDPC parity data is combined with the input data to obtain LDPC encoded data in systematic form. In one example, the parity data is appended to the end of the input data to obtained LDPC encoded data. In various embodiments, step 304 is performed by a variety of processors, either general purpose processors configured at least temporarily to perform the combination or specially designed components permanently so configured. With respect to FIG. 2A, there is no corresponding component in FIG. 2A which performs step 304.

The following figures show some examples of how the high density matrix ($H_p^{-1}$) and low density sub-matrix ($H_i$) are obtained from a parity check matrix. First, a process for obtaining $H_p^{-1}$ and is described. Then, an exemplary parity check matrix is described and the processing is explained using the exemplary parity check matrix.

Figure 4:
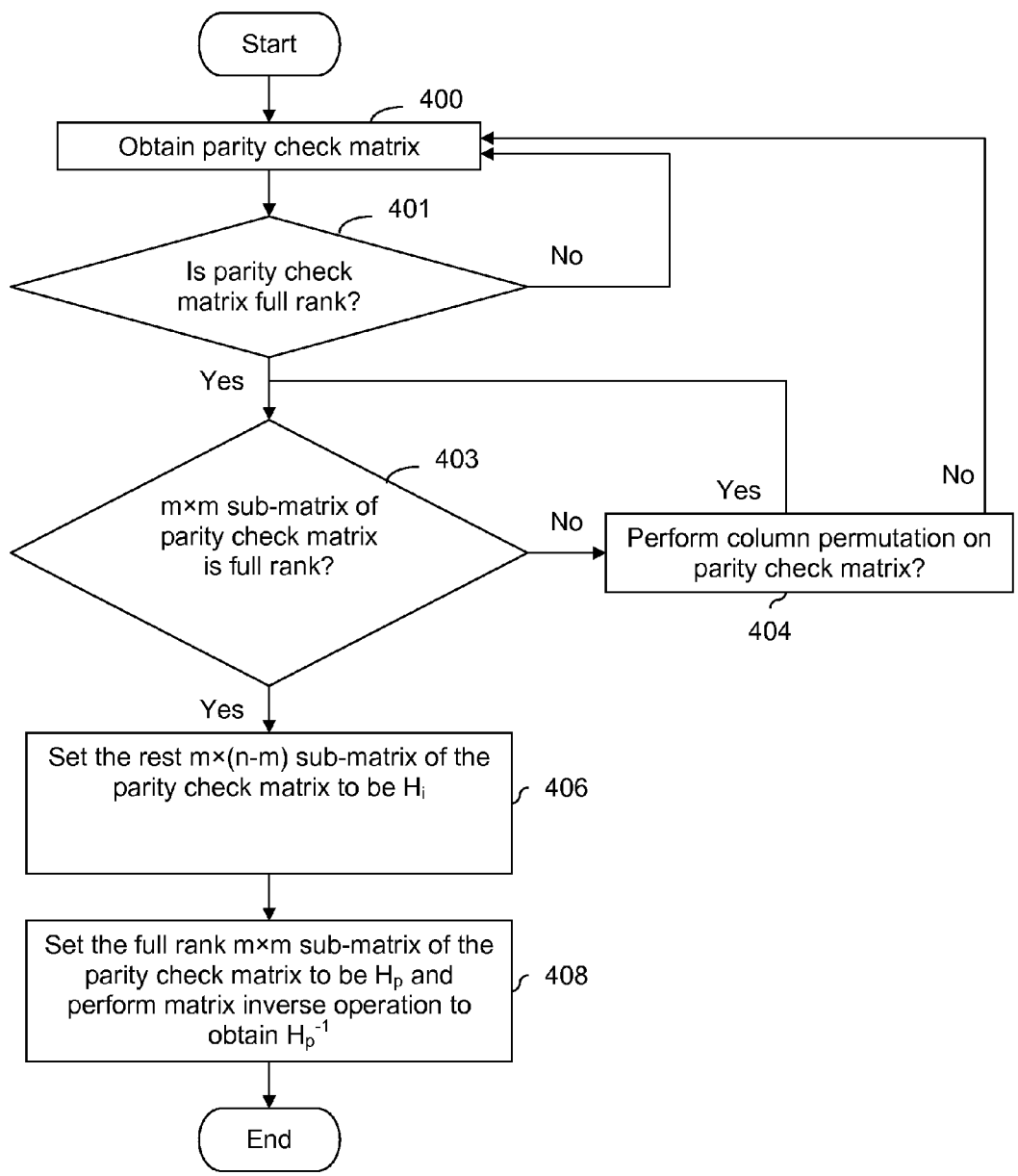
FIG. 4 is a diagram showing an embodiment of a process for obtaining a high density matrix $H_p^{-1}$ and low density sub-matrix of a parity check matrix.

FIG. 4 is a diagram showing an embodiment of a process for obtaining a high density matrix $H_p^{-1}$ and low density sub-matrix of a parity check matrix. At 400, a parity check matrix is obtained. At 401, it is determined if the parity check matrix is a full rank matrix. In this embodiment, the parity check matrix is expected to be a full rank matrix (since without a full rank constraint, the inversion operation is not always possible for $H_p$). If the parity check matrix (H) is not a full rank matrix then a new parity check matrix is obtained at 400.

If the parity check matrix is a full rank matrix then it is determined at 403 if a m×m sub-matrix of a parity check matrix is full rank (to ensure inversion is possible). In such embodiments, the determination at 403 includes determining whether the m columns and m rows on the right (or left) hand side of the parity check matrix comprise a full rank matrix.

If the m×m sub-matrix on the right hand of the parity check matrix is not a full rank matrix, a permutation is performed on the parity check matrix at 404. For example, in case QC-LDPC code, two circulant-columns (circulant-column refers to a column of circulants, permutation in unit of circulant-column can help to maintain the QC structure) switch with each other. The process of performing a permutation on the parity check matrix is repeated at 404 until it is determined at 403 that the m×m sub-matrix on the right hand of the parity check matrix is a full rank matrix. Otherwise, a new parity check matrix is obtained at 400.

Once the m×m sub-matrix on the right hand of the parity check matrix is a full rank matrix, the low density sub-matrix on the left hand of the parity check matrix is set to $H_i$ at 406. In some embodiments, the low density sub-matrix comprises the m rows and (n−m) columns on the left hand side of the parity check matrix and that part of the parity matrix (which includes any necessary permutations applied) is selected to be $H_i$. At 408, the m×m sub-matrix on the right hand of the parity check matrix is inversed to get a high density matrix $H_p^{-1}$. For example, the m columns and m rows on the right hand side of the parity check matrix (including any permutations) is selected to be $H_p$ and a matrix inverse operation is performed on $H_p$.

In various embodiments, the permutations performed on a parity check matrix at 404 are not limited to a unique combination or sequence of permutations. As a result, the sub-matrix $H_i$ and $H_p/H_p^{-1}$ obtained at 406 and 408, respectively, may result in multiple solutions as opposed to a unique solution (i.e., even if the same parity check matrix is input to the process different results may occur). Although there may be more than one result to the process shown, the strength of the code and the properness of the resulting encoding using the obtained sub-matrix $H_i$ and matrix $H_p^{-1}$ are not compromised. Any different sub-matrices of the parity check matrix which result may produce different parity data, but the coding strength and properness of the encoding remains the same.

In some embodiments, the process described above is performed a priori and the resulting matrix $H_p^{-1}$ and sub-matrix $H_i$ are programmed into and stored by a storage system (e.g., that shown in FIG. 1) or an encoder therein (e.g., the encoder shown in FIG. 2A). In some embodiments, a parity check matrix is input to a storage system and the storage system (or an encoder within) performs the processing described above. That is, a process of determining the matrix $H_p^{-1}$ and the sub-matrix may be performed internal to or external to an encoder or a system which includes an encoder.

Figure 5:
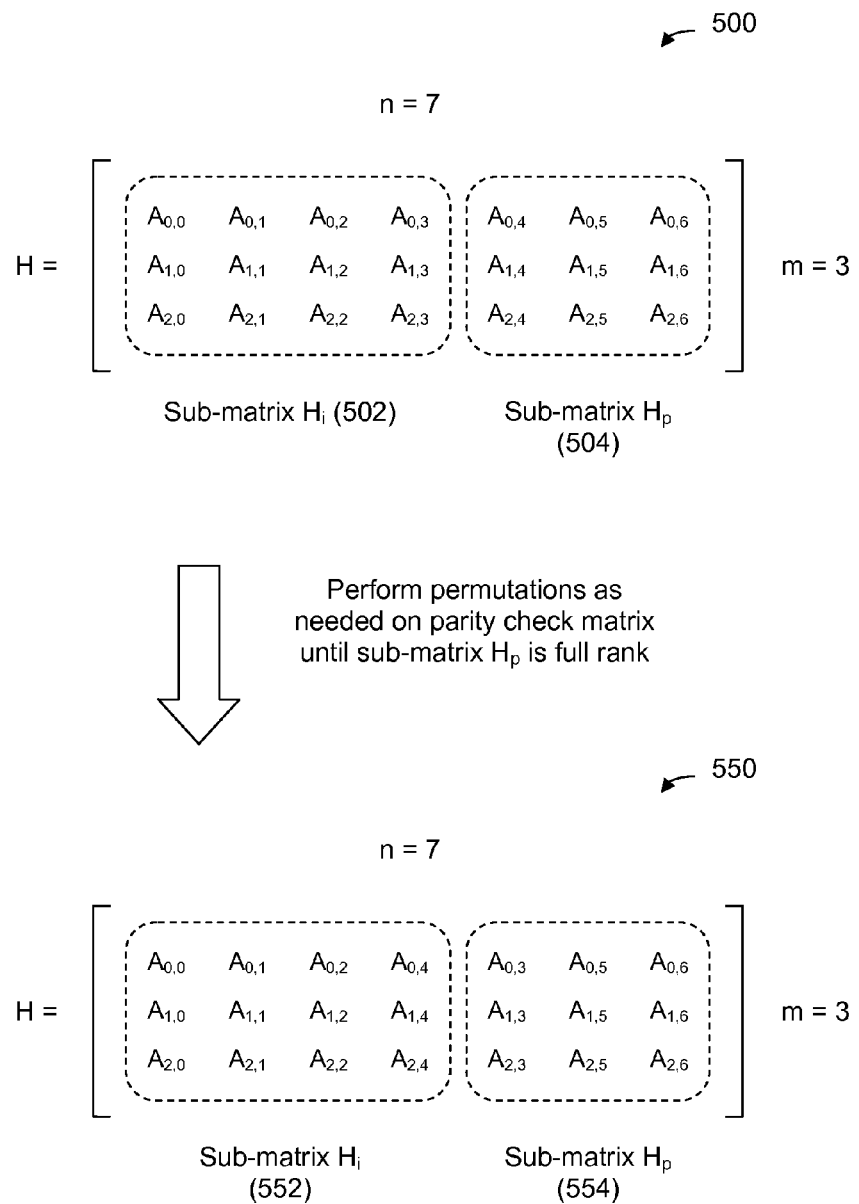
FIG. 5 is a diagram showing an embodiment of a parity check matrix which is processed to produce a matrix $H_p^{-1}$ and the sub-matrix R.

FIG. 5 is a diagram showing an embodiment of a parity check matrix which is processed to produce a matrix $H_p^{-1}$ and the sub-matrix $H_i$. The process shown in FIG. 4 will be explained using parity check matrix 500 as an example.

Parity check matrix 500 is a 3×7 matrix. Sub-matrix $H_i$ 502 in this example comprises the space occupied by the 3 rows and 4 columns on the left hand side of parity check matrix 500 and the space occupied by the 3 columns and 3 rows on the right hand side of parity check matrix 500 comprise sub-matrix $H_p$ 504.

It is determined if the sub-matrix $H_p$ 504 is a full rank matrix. For example, this includes checking that all rows are independent of all other rows. In this example, the rows of parity check matrix 500 are $A_{0,4}$-$A_{0,6}$, $A_{1,4}$-$A_{1,6}$ and $A_{2,4}$-$A_{2,6}$.

Permutations are performed on parity check matrix 500 as/if needed until the sub-matrix $H_p$ (504) is a full rank matrix. In one example, if the sub-matrix comprised of $A_{0,4}$-$A_{0,6}$, $A_{1,4}$-$A_{1,6}$ and $A_{2,4}$-$A_{2,6}$ is not full rank, the column (circulant-column in QC-LDPC case) $A_{*,4}$ is switched with column (circulant-column in QC-LDPC case) $A_{*,3}$.

Processed parity check matrix 550 results from the one or more permutations and has the property that the elements located within location 504 comprise a full rank matrix. For example, the sub-matrix comprised of $A_{0,3}$ $A_{0,5}$ $A_{0,6}$, $A_{1,3}$ $A_{1,5}$ $A_{1,6}$ and $A_{2,3}$ $A_{2,5}$ $A_{2,6}$ is full rank. With this condition satisfied, the elements located within location 504 are selected to be sub-matrix ($H_p$) 554 and the elements located in location 502 are selected to be the sub-matrix ($H_i$) 552.

In some embodiments, each element $A_{i,j}$ is itself a matrix. In one example of this, each element $A_{i,j}$ is a matrix which has quasi-cyclic properties and the parity check matrix is a quasi-cyclic low-density parity-check (QC-LDPC) parity check matrix. QC-LDPC codes are a subset of LDPC codes where the parity check matrix (H) has some repetition (e.g., each row is a cyclic shift of the row before it). This regularity or repetition enables smaller storage requirements (e.g., of the parity check matrix) and/or easier encoder implementation compared to some other (e.g., unconstrained) LDPC codes. In some embodiments, the technique described herein uses QC-LDPC codes (e.g., the parity check matrix is a QC-LDPC parity check matrix). Quasi-cyclic property is not, however, a requirement of the technique and in some embodiments non-QC-LDPC codes and/or non-QC-LDPC parity check matrices are used. Non-QC LDPC codes can be seen as a special case of QC-LDPC codes with circulant size of 1. The following figure shows an example of a QC-LPDC parity check matrix.

Figure 6:
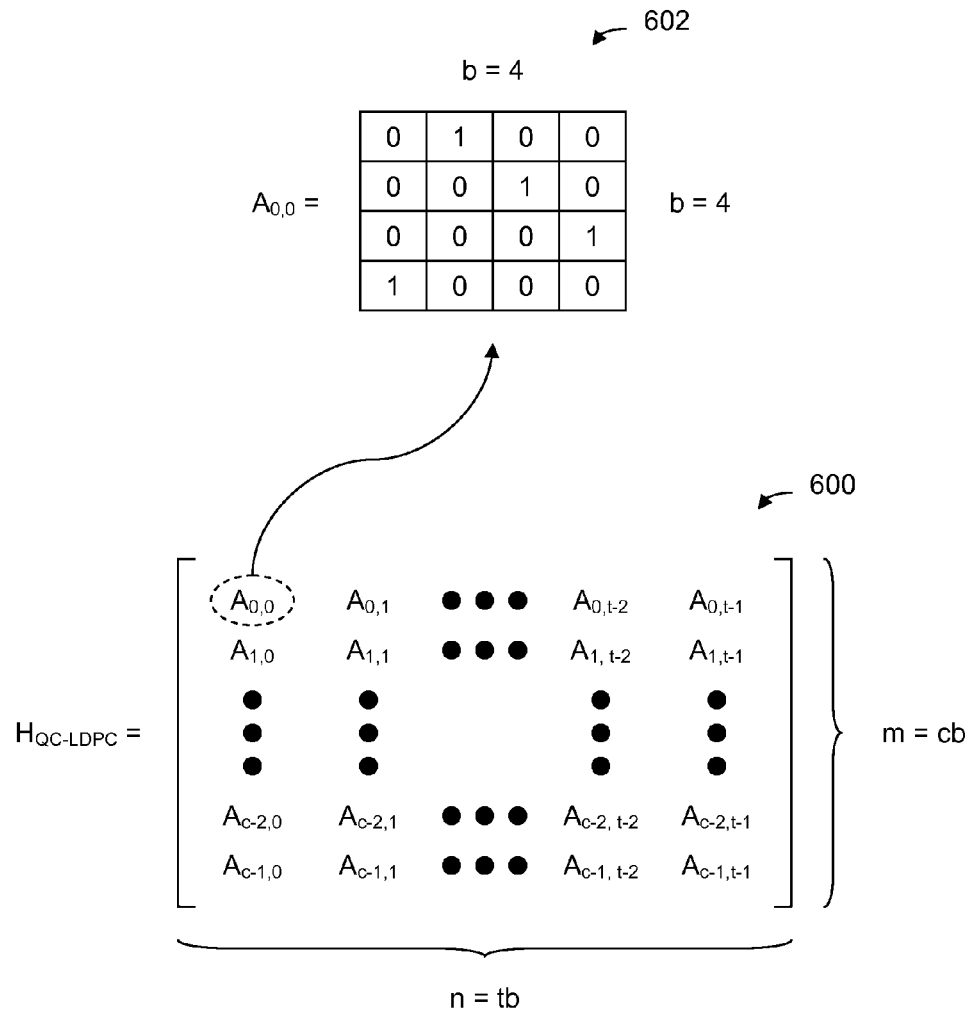
FIG. 6 is a diagram illustrating an embodiment of a QC-LDPC parity check matrix.

FIG. 6 is a diagram illustrating an embodiment of a QC-LDPC parity check matrix. In the example shown, QC-LDPC parity check matrix ($H_{QC-LDPC}$) is an m×n matrix where both m and n is the product of two integers (i.e., c and b in the case of m and t and b in t. QC-LDPC parity check matrix 600 includes one or more circulants, $A_{i,j}$. A circulant is a square matrix having dimensions b×b where each row is a cyclic shift (e.g., to the right) of the row before it. Circulant 602 shows an example circulant for $A_{0,0}$. In this example, b=4 and each row in circulant 602 is a copy of the previous row which is cyclically shifted one place to the right where values at the end wrap around to the beginning.

Using a parity check matrix which is a QC-LDPC parity check matrix reduces the amount of storage needed to store the matrix $H_p^{-1}$ and the sub-matrix $H_i$ associated with a code. This is because a QC-LDCP parity matrix produces a matrix $H_p^{-1}$ and a sub-matrix $H_i$ for which both matrices have repetition embedded within and less information needs to be stored as a result. The table below shows a comparison of storage requirements for storing a sub-matrix $H_i$ and a matrix $H_p^{-1}$ when beginning with a QC-LDPC parity matrix as opposed to a non-QC-LDPC parity matrix.

TABLE 2

|  | Storage Requirements (Bits) | Storage Requirements for QC-LDPC (Bits) |
|---|---|---|
| $H_i$ | m × (n − m) | (m × (n − m))/b |
| $H_p^{-1}$ | m × m | (m × m)/b |

Figure 7:
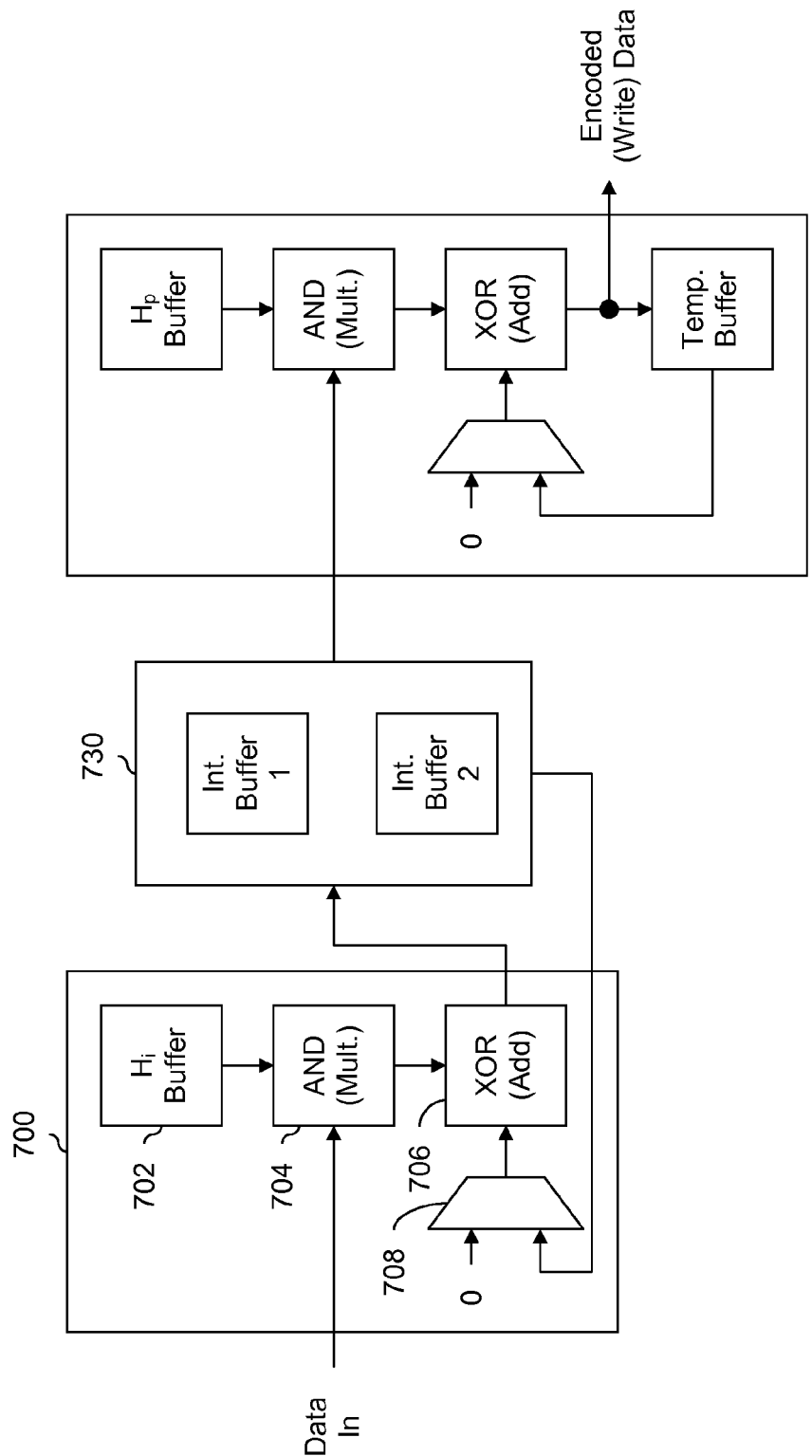
FIG. 7 is a diagram illustrating an embodiment of a two stage LDPC encoder which includes AND gates and XOR (exclusive OR) gates to perform matrix operations.

FIG. 7 is a diagram illustrating an embodiment of a two stage LDPC encoder which includes AND gates and XOR (exclusive OR) gates to perform matrix operations. In some embodiments, first encoding stage 200, intermediate buffer 202 and second encoding stage 204 are implemented as shown.

To illustrate the system shown in FIG. 7, consider the example where the input data u=[$u_0$ $u_1$], the sub-matrix $$H_i = \begin{bmatrix} A'_{0,0} & A'_{0,1} \\ A'_{1,0} & A'_{1,1} \end{bmatrix}$$

and the matrix $$H_p^{-1} = \begin{bmatrix} A'_{0,2} & A'_{0,3} \\ A'_{1,2} & A'_{1,3} \end{bmatrix}^{-1}.$$

The table below shows at various points in time what information exists within first encoding stage 700. The operation performed by the first encoding stage is t=u*$H_i^T$ or t=

$$[u_0 u_1]\begin{bmatrix} A'_{0,0} & A'_{1,0} \\ A'_{0,1} & A'_{1,1} \end{bmatrix}.$$

For simplicity, only the processing associated with the first encoding stage 700 is described herein; the operation of the second encoding stage is similar.

TABLE 3

| Data In | Output of $H_i$ Buffer | Output of Multiplexer | Intermediate Data Stored in IB |
|---|---|---|---|
| $u_0$ | $A'_{0,0}$ | 0 | $u_0 \times A'_{0,0}$ |
| $u_0$ | $A'_{1,0}$ | 0 | ($u_0 \times A'_{0,0}$); ($u_0 \times A'_{1,0}$) |
| $u_1$ | $A'_{0,1}$ | $u_0 \times A'_{0,0}$ | ($u_0 \times A'_{0,0} + u_1 \times A'_{0,1}$); ($u_0 \times A'_{1,0}$) |
| $u_1$ | $A'_{1,1}$ | $u_0 \times A'_{1,0}$ | ($u_0 \times A'_{0,0} + u_1 \times A'_{0,1}$); ($u_0 \times A'_{1,0} + u_1 \times A'_{1,1}$) |

As shown in the table above, at a first point in time, first the multiplication $u_0 \times A'_{0,0}$ is performed. Since XOR 706 corresponds to an add (which is not needed at this time), the output of the multiplexer (708) is a 0 which effectively "turns off" the XOR. Adder 706 adds the two inputs passed to it, so having a 0 at one of the inputs of the adder turns it off The output of buffer 702 is $A'_{0,0}$ which when combined with the data in (i.e., $u_0$) by AND 704 produces the product $u_0 \times A'_{0,0}$.

At a second point in time, a second multiplication of ($u_0 \times A'_{1,0}$) is performed, the result of which is also stored in an intermediate buffer (e.g., one of the buffers in 730). Similar to the previous step, since no addition is being performed, the output of multiplexer is 0 which turns off XOR 706. To perform the multiplication, $A'_{1,0}$ is retrieved from and output by $H_i$ buffer 702 at the same time $u_0$ is at the input.

At a third point in time, a third multiplication of ($u_1 \times A'_{0,1}$) and this product is added to ($u_0 \times A'_{0,0}$) which is stored in the intermediate buffer. Since an addition is being performed at this time, the output of multiplexer 708 is ($u_0 \times A'_{0,0}$) as opposed to a 0 (which would "turn off" the adder). This sum is then stored in the intermediate buffer.

At a fourth point in time, a fourth multiplication of ($u_1 \times A'_{1,1}$) is performed which is added to ($u_0 \times A'_{1,0}$) which is stored in the intermediate buffer. To perform the multiplication, $A'_{1,1}$ is retrieved from and output by $H_i$ buffer 702 at the same time that input $u_1$ is coming in.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for performing low-density parity-check (LDPC) encoding, comprising:
   a first encoder configured to encode input data using a first sub-matrix of a parity check matrix to obtain intermediate data, wherein:
      the parity check matrix includes the first sub-matrix and a second sub-matrix having a matrix inversion;
      the parity check matrix is an m×n matrix;
      the first sub-matrix is an m×(n−m) matrix; and
      the matrix inversion of the second sub-matrix is an m×m matrix; and
   a second encoder configured to encode the intermediate data using the matrix inversion of the second sub-matrix of the parity check matrix.

2. The system of claim 1, wherein the parity check matrix includes a quasi-cyclic low-density parity-check (QC-LDPC) parity check matrix.

3. The system of claim 1, wherein the parity check matrix is a full rank matrix.

4. The system of claim 1, wherein:
   the second encoder is configured to encode the intermediate data by generating parity data; and
   the system further includes a combiner configured to combine the parity data with the input data to obtain LDPC encoded data.

5. The system of claim 1 further comprising storage configured to store the encoded intermediate data generated by the first encoder.

6. The system of claim 1 further comprising a first buffer and a second buffer, wherein the first buffer is configured to store in the first buffer a first set of intermediate data received from the first encoder while simultaneously the second buffer is configured to pass a second set of intermediate data from the second buffer to the second encoder.

7. The system of claim 1, wherein the first encoder is configured to:
   divide up the input data into a plurality of portions; and
   repeatedly use the first encoder to encode each of the plurality of portions.

8. A system for performing low-density parity-check (LDPC) encoding, comprising:
   a first encoder configured to encode input data using a first sub-matrix of a parity check matrix to obtain intermediate data, wherein the parity check matrix includes the first sub-matrix and a second sub-matrix having a matrix inversion; and
   a second encoder configured to encode the intermediate data using the matrix inversion of the second sub-matrix of the parity check matrix, wherein the second encoder is configured to:
      divide up the intermediate data into a plurality of portions; and
      repeatedly use the second encoder to encode each of the plurality of portions.

9. A method for performing low-density parity-check (LDPC) encoding, comprising:
   using a first encoder to encode input data using a first sub-matrix of a parity check matrix to obtain intermediate data, wherein the parity check matrix includes the first sub-matrix and a second sub-matrix having a matrix inversion; and
   using a second encoder to encode the intermediate data using the matrix inversion of the second sub-matrix of the parity check matrix, including by:
      dividing up the intermediate data into a plurality of portions; and
      repeatedly using the second encoder to encode each of the plurality of portions.

10. The method of claim 9 further comprising storing data encoded using the method recited in claim 9 in magnetic disk storage.

11. The method of claim 9, wherein the parity check matrix includes a quasi-cyclic low-density parity-check (QC-LDPC) parity check matrix.

12. The method of claim 9, wherein the parity check matrix is a full rank matrix.

13. The method of claim 9, wherein:
   using the second encoder includes generating parity data; and
   the method further includes combining the parity data with the input data to obtain LDPC encoded data.

14. The method of claim 9 further comprising storing the encoded intermediate data generated by the first encoder.

15. The method of claim 9 further comprising using a first buffer to store a first set of intermediate data received from the first encoder and using a second buffer to simultaneously pass a second set of intermediate data from the second buffer to the second encoder.

16. The method of claim 9, wherein using the first encoder includes:
   dividing up the input data into a plurality of portions; and
   repeatedly using the first encoder to encode each of the plurality of portions.

17. A method for performing low-density parity-check (LDPC) encoding, comprising:
   using a first encoder to encode input data using a first sub-matrix of a parity check matrix to obtain intermediate data, wherein:
      the parity check matrix includes the first sub-matrix and a second sub-matrix having a matrix inversion;
      the parity check matrix is an m×n matrix;
      the first sub-matrix is an m×(n−m) matrix; and
      the matrix inversion of the second sub-matrix is an m×m matrix; and using a second encoder to encode the intermediate data using the matrix inversion of the second sub-matrix of the parity check matrix.

18. A computer program product for performing low-density parity-check (LDPC) encoding, the computer program product being embodied in a non-transitory computer readable storage medium and comprising computer instructions for:
    encoding input data using a first sub-matrix of a parity check matrix to obtain intermediate data, wherein:
        the parity check matrix includes the first sub-matrix and a second sub-matrix having a matrix inversion;
        the parity check matrix is an m×n matrix;
        the first sub-matrix is an m×(n−m) matrix; and
        the matrix inversion of the second sub-matrix is an m×m matrix; and
    encoding the intermediate data using the matrix inversion of the second sub-matrix of the parity check matrix.

19. A computer program product for performing low-density parity-check (LDPC) encoding, the computer program product being embodied in a non-transitory computer readable storage medium and comprising computer instructions for:
    encoding input data using a first sub-matrix of a parity check matrix to obtain intermediate data, wherein the parity check matrix includes the first sub-matrix and a second sub-matrix having a matrix inversion; and
    encoding the intermediate data using the matrix inversion of the second sub-matrix of the parity check matrix, including by:
        dividing up the intermediate data into a plurality of portions; and
        repeatedly using the second encoder to encode each of the plurality of portions.

* * * * *